(12) United States Patent
Cho et al.

(10) Patent No.: US 7,736,530 B2
(45) Date of Patent: Jun. 15, 2010

(54) CMP SLURRY AND METHOD FOR POLISHING SEMICONDUCTOR WAFER USING THE SAME

(75) Inventors: Seung Beom Cho, Daejeon (KR); Jong Pil Kim, Daejeon (KR); Jun Seok Nho, Daejeon (KR); Myoung Hwan Oh, Daejeon (KR); Jang Yul Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 11/657,051

(22) Filed: Jan. 24, 2007

(65) Prior Publication Data

US 2007/0191244 A1 Aug. 16, 2007

(30) Foreign Application Priority Data

Jan. 25, 2006 (KR) ...................... 10-2006-0007995

(51) Int. Cl.
*C09K 13/04* (2006.01)
(52) U.S. Cl. ...................... 252/79.2; 252/79.1; 438/69.1
(58) Field of Classification Search ................. 438/691, 438/692, 693, 700; 252/79.1, 79.2; 216/103
See application file for complete search history.

(56) References Cited

U.S. PATENT DOCUMENTS

| 6,211,118 | B1 | 4/2001 | Hoshi | |
|---|---|---|---|---|
| 6,420,269 | B2 | 7/2002 | Matsuzawa et al. | |
| 6,527,818 | B2 | 3/2003 | Hattori et al. | |
| 6,602,436 | B2 | 8/2003 | Mandigo et al. | |
| 6,776,810 | B1 * | 8/2004 | Cherian et al. | ................. 51/307 |
| 2003/0124959 | A1 * | 7/2003 | Schroeder et al. | ............. 451/41 |
| 2004/0216388 | A1 * | 11/2004 | Mathur et al. | ................. 51/298 |
| 2004/0229461 | A1 * | 11/2004 | Darsillo et al. | .............. 438/689 |
| 2005/0164510 | A1 * | 7/2005 | Ikeda et al. | ................. 438/692 |

FOREIGN PATENT DOCUMENTS

| JP | 10-106988 | 4/1998 |
|---|---|---|
| JP | 10-154672 | 6/1998 |
| JP | 10-270401 | 10/1998 |
| JP | 2000-109794 | 4/2000 |
| JP | 2000-109815 | 4/2000 |
| JP | 2001-035820 | 2/2001 |
| JP | 2001-037951 | 2/2001 |

(Continued)

*Primary Examiner*—Lan Vinh
(74) *Attorney, Agent, or Firm*—McKenna Long & Aldridge LLP (57) ABSTRACT

Disclosed is a CMP slurry in which a compound having a weight-average molecular weight of 30-500 and containing a hydroxyl group (OH), a carboxyl group (COOH), or both, is added to a CMP slurry comprising abrasive particles and water and having a first viscosity, so that the CMP slurry is controlled to have a second viscosity 5-30% lower than the first viscosity. Also disclosed is a method for polishing a semiconductor wafer using the CMP slurry. According to the disclosed invention, the agglomerated particle size of abrasive particles in the CMP slurry can be reduced, while the viscosity of the CMP slurry can be reduced and the global planarity of wafers upon polishing can be improved. Thus, the CMP slurry can be advantageously used in processes for manufacturing semiconductor devices requiring fine patterns and can improve the reliability and production of semiconductor devices through the use thereof in semiconductor processes.

18 Claims, 2 Drawing Sheets

| | FOREIGN PATENT DOCUMENTS | |
|---|---|---|
| JP | 2001-319900 | 11/2001 |
| JP | 2006-019740 | 1/2006 |
| KR | 10-2001-0108048 | 12/2001 |
| KR | 10-2002-0015697 | 2/2002 |
| KR | 10-2003-0039999 | 5/2003 |
| KR | 10-2004-0013299 | 2/2004 |
| KR | 10-2004-0057653 | 7/2004 |
| KR | 10-2004-0095118 | 11/2004 |
| KR | 10-2004-0098671 | 11/2004 |
| KR | 10-2005-0004051 | 1/2005 |

* cited by examiner

CMP SLURRY AND METHOD FOR POLISHING SEMICONDUCTOR WAFER USING THE SAME

This application claims the benefit of the filing date of Korean Patent Application No. 2006-7995, filed on Jan. 25, 2006, in the Korean Intellectual Property Office, the disclosure of which is incorporated herein in its entirety by reference.

TECHNICAL FIELD

The present invention relates to a CMP slurry, and more particularly to a CMP slurry which can improve the within-wafer non-uniformity of wafers, and thus can be used in processes for manufacturing semiconductor devices requiring fine patterns.

BACKGROUND ART

As microelectronic devices have been continuously provided with a larger integration scale, planarization processes used for manufacturing such microelectronic devices have become more and more important. As a part of attempts to obtain very large scale integrated microelectronic devices, multiple interconnection technique and multilayer stacking technique have generally been used for semiconductor wafers. However, non-planarization occurring after carrying out one of the above techniques causes many problems. Therefore, planarization processes are applied to various steps in a microelectronic device manufacturing process, so as to minimize irregularity on wafer surfaces.

One of these planarization techniques is CMP (chemical mechanical polishing). During the process of CMP, a wafer surface is pressed against a polishing pad that rotates relative to the surface, and an abrasive and a chemical reagent known as CMP slurry is introduced into the polishing pad during the polishing process, so that planarization of a wafer surface is accomplished by way of chemical and physical actions.

One example, to which the CMP process is applied, is shallow trench isolation (STI). In the STI technique, relatively shallow trenches are formed, and such trenches are used in forming field regions for separating active regions on wafer surfaces.

Figure 1:
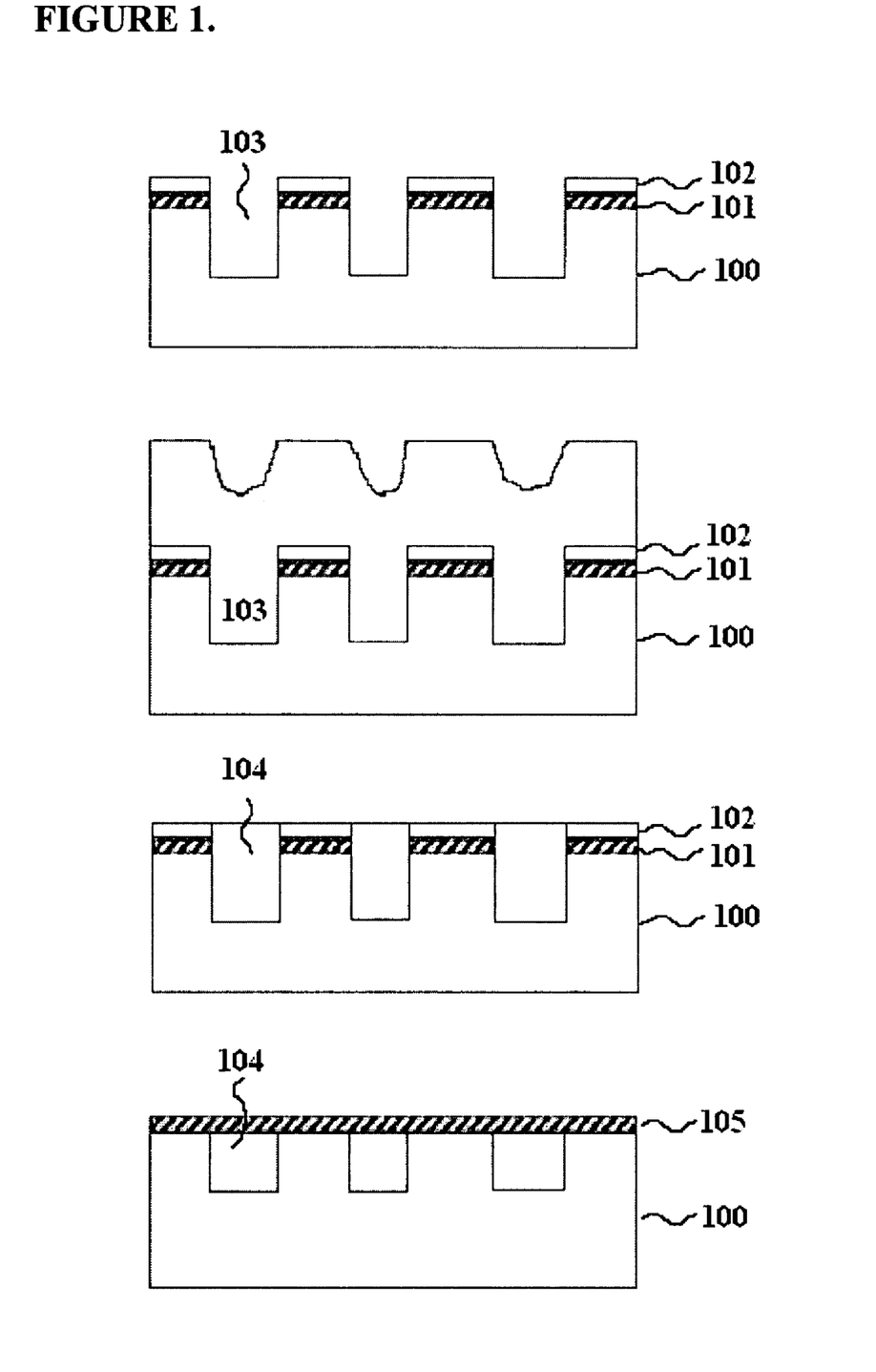
FIG. 1 shows a general STI process.

A general STI process is shown in FIG. 1. As shown in FIG. 1, a pad silicon oxide ($SiO_2$) layer 101 and a silicon nitride ($Si_3N_4$) layer 102 are formed successively on a semiconductor wafer. Next, a photoresist pattern is formed on the $Si_3N_4$ layer 102. Then, the $Si_3N_4$ layer 102, the pad silicon oxide layer 101 and the semiconductor wafer 100 are partially etched by using the photoresist pattern as a mask, so that a plurality of trenches 103 is formed.

Further, in order to form field regions, an insulating silicon oxide layer 104 is deposited by way of LPCVD (low pressure chemical vapor deposition), PECVD (plasma enhanced chemical vapor deposition) or HDPCVD (high density plasma chemical vapor deposition) technique, so that the trenches 103 are filled with the layer 104 and the surface of the $Si_3N_4$ layer 102 is covered with the layer 104. Subsequently, the insulating silicon oxide layer 104 is polished until the $Si_3N_4$ layer 102 is exposed. Additionally, the $Si_3N_4$ layer 102 placed between two adjacent active regions, as well as the pad silicon oxide layer 101 is removed by etching. Finally, a gate silicon oxide layer 105 is formed on the surface of the semiconductor wafer.

Herein, during the progress of the CMP process for removing the insulating silicon oxide layer 104, the insulating silicon oxide layer 104 and the $Si_3N_4$ layer 102 show different removal rates due to their different chemical and physical properties.

The ratio of the removal rate of the insulating silicon oxide layer to that of the silicon nitride layer is referred to as the selectivity of CMP slurry. As the selectivity of CMP slurry decreases, the amount of the $Si_3N_4$ layer removed by the slurry increases. It is preferable that the $Si_3N_4$ layer is not removed. In other words, preferably the selectivity of the insulating silicon oxide layer to the $Si_3N_4$ layer is infinite. However, conventional CMP slurry has a low polishing selectivity of the insulating silicon oxide layer to the $Si_3N_4$ layer, which is about 4:1. Hence, the $Si_3N_4$ layer is polished to a degree exceeding the acceptable range in a practical CMP process. As a result, the $Si_3N_4$ layer pattern may be removed non-uniformly depending on locations in a wafer during a CMP process. Therefore, the $Si_3N_4$ layer has a variable thickness over the whole wafer. Particularly, this is a serious problem in the case of a semiconductor wafer that has a highly dense pattern simultaneously with a sparse pattern. Due to the above-mentioned problem, a final structure having field regions has a level difference between active regions and field regions, resulting in reduction of the margin of subsequent steps for manufacturing a semiconductor device, and degradation of the quality of a transistor and a device. Briefly, conventional CMP processes are problematic in that a $Si_3N_4$ layer pattern with a uniform thickness cannot be obtained even after removing the oxide layer via a CMP process.

In addition to such problems occurring in local planarization, the conventional technology has many problems in global planarization of a wafer. When the global cross section of a wafer polished according to the conventional technology is analyzed, it can be seen that the central portion of the wafer is polished more than the edge portion, so that the wafer shows a U-shaped or W-shaped cross section and has high within-wafer non-uniformity. It is known that the reason for such polishing characteristics is that the distribution of mechanical pressure against a wafer and a polishing pad is non-uniform, so that the distribution of abrasive slurry or abrasive particles during polishing is non-uniform, and thus the polishing rate of the central portion of the wafer is relatively increased.

Due to this high within-wafer non-uniformity, in actual semiconductor processes, the process margin of a silicon nitride layer is increased to stably secure the end time point of polishing. For example, it is possible to use a method of forming an initial silicon nitride layer thicker than the thickness difference of a polished silicon nitride layer between the central portion and edge portion of the wafer. However, this method has a problem of causing process inefficiency.

Prior techniques relating to the preparation of this STI CMP slurry will now be described.

The following patent documents relating to a method for preparing a high-selectivity cerium oxide slurry, invented in Hitachi Chemical Co., Ltd., Japan, disclose additives for achieving dispersion stability and high selectivity in cerium oxide slurry compositions: Japanese Patent Laid-Open Publication No. 1998-106988; Japanese Patent Laid-Open Publication No. 1998-154672; Japanese Patent Laid-Open Publication No. 1998-27041; Japanese Patent Publication Nos. 2000-109794 and 2000-109815 (Apr. 18, 2000); Japanese Patent Laid-Open Publication Nos. 2001-37951, 2001-35820 and 2001-319900; Korean Patent Laid-Open Publication Nos. 2001-0108048 and 2002-0015697; U.S. Pat. No. 6,211,118B1 (Apr. 24, 2001) and U.S. Pat. No. 6,420,269B2 (Jul. 16, 2002). However, such techniques according to the prior art are problematic in that their application ranges are too broad and are not clearly defined, and merely provide basic information about polishing rates and selectivity ratios. Therefore, such techniques are not practically applicable. In addition, these patent documents do not disclose technical contents and effects about the global planarization of wafers.

In addition to the above, domestic semiconductor and slurry fabricating companies have developed an additive for increasing the polishing selectivity of cerium oxide slurry, the additive comprising a linear polymer alone or in combination with a low-molecular weight material. Such additives are disclosed in Korean Laid-Open Patent Nos. 2003-0039999, 2004-0057653, 2004-0013299, 2004-0098671, 2004-0095118 and 2005-0004051. However, these patent documents disclose only increasing polishing rate and polishing selectivity and do not disclose technical contents and effects about global planarization characteristics.

Meanwhile, as prior techniques for improving global planarization characteristics, a method of adding an additive comprising an organic polymer material, for example, is known. However, this method has a problem in that it increases the viscosity of slurry, because a significant amount of the additive should be added in order to reduce within-wafer non-uniformity to the desired level.

DISCLOSURE OF THE INVENTION

The present inventors have found that, when a compound having a weight-average molecular weight of 30-500 and containing a hydroxyl group (OH), a carboxyl group (COOH), or both, is added to a CMP slurry, the viscosity of the CMP slurry can be decreased, and within-wafer non-uniformity upon polishing can be decreased.

Accordingly, an object of the present invention is to provide a CMP slurry comprising a compound, which has a weight-average molecular weight of 30-500 and contains a hydroxyl group (OH), a carboxyl group (COOH), or both, and a method for polishing a semiconductor wafer using said CMP slurry.

To achieve the above object, the present invention provides a CMP slurry in which a compound having a weight-average molecular weight of 30-500 and containing a hydroxyl group (OH), a carboxyl group (COOH), or both, is added to a CMP slurry comprising abrasive particles and water and having a first viscosity, so that the CMP slurry is controlled to have a second viscosity 5-30% lower than the first viscosity.

In another aspect, the present invention provides a method for polishing a semiconductor wafer, using said CMP slurry.

Hereinafter, the present invention will be described in detail.

The CMP slurry of the present invention comprises a compound having a weight-average molecular weight of 30-500 and containing a hydroxyl group (OH), a carboxyl group (COOH), or both, so that the viscosity of the CMP slurry reduce by 5-30%.

As used herein, the term "first viscosity" refers to the viscosity of a CMP slurry (containing abrasive particles, water and other dispersants), which does not contain a compound having a weight-average molecular weight of 30-500 and containing a hydroxyl group (OH), a carboxyl group (COOH), or both. The term "second viscosity" refers to the viscosity of a CMP slurry, which contains a compound having a weight-average molecular weight of 30-500 and containing a hydroxyl group (OH), a carboxyl group (COOH), or both.

As described above, the prior CMP slurry has a problem in that it shows poor global planarity when it is used to polish a wafer. The global planarity is referred to as Within-Wafer Non-Uniformity (WIWNU; %), which is obtained by dividing the thickness standard deviation (S.D.) of a wafer after polishing by the average thickness. Lower WIWNU means better global planarity. When the inventive CMP slurry, which contains the compound having a weight-average molecular weight of 30-500 and containing a hydroxyl group (OH), a carboxyl group (COOH), or both, is used to polish a semiconductor wafer, the WIWNU can be reduced to less than 6.5%.

Because the inventive CMP slurry has a low viscosity by containing the compound having a weight-average molecular weight of 30-500 and containing a hydroxyl group (OH), a carboxyl group (COOH), or both, it can come into more uniform contact with a polishing pad and a wafer by the Newtonian behavior upon polishing of the wafer, and thus provide a uniform polished surface throughout the wafer, resulting in an improvement in within-wafer non-uniformity (WIWNU).

Meanwhile, the prior CMP slurry frequently contains a large amount of an additive comprising a polymer material in order to improve within-wafer non-uniformity. For example, because a polymer additive for improving selectivity is frequently added in an amount of 180 wt % based on the weight of abrasive particles, and a polymer additive for improving within-wafer non-uniformity is frequently added in an amount of 200-300 wt % based on the weight of abrasive particles, the viscosity of the CMP slurry also increases to 2.0 cPs or higher. In this case, within-wafer non-uniformity is improved, but there are problems in that, because the viscosity of slurry is increased, the polishing rate of a silicon oxide layer is decreased, leading to deterioration in polishing efficiency, and abrasive particles are agglomerated, resulting in an increase in particle size, leading to an increase in the occurrence of scratches.

However, the CMP slurry of the present invention can show excellent global planarity and have a viscosity range suitable for CMP polishing, even if it does not contain a large amount of a polymer additive. Thus, the second viscosity of the inventive CMP slurry, which contains the above compound having a weight-average molecular weight of 30-500 and containing a hydroxyl group (OH), a carboxyl group (COOH), or both, is preferably in a range of 1.1-1.9 cps (at room temperature).

The compound having a weight-average molecular weight of 30-500 and containing a hydroxyl group (OH), a carboxyl group (COOH), or both, as described in the present invention, can be added alone or in combination with other CMP slurry components, for example, an additive composition or an abrasive particle dispersion, to the inventive CMP slurry.

Figure 2:
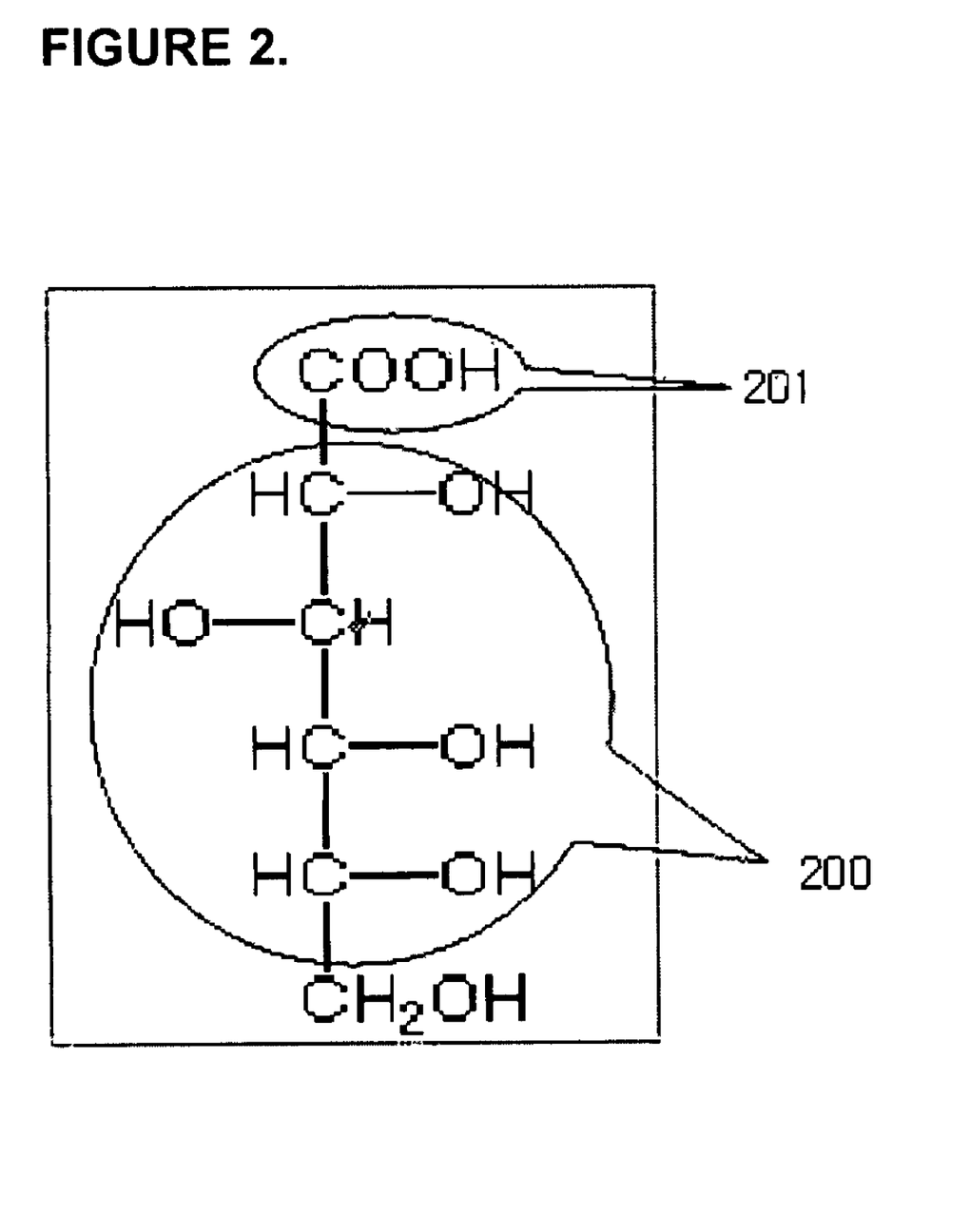
FIG. 2 illustrates an example of a compound having a weight-average molecular weight of less than 500 and containing a hydroxyl group (OH) and/or a carboxyl group, according to one embodiment of the present invention.

As shown in FIG. 2, the compound contained in the inventive CMP slurry may contain at least one selected from among a hydroxyl group (OH) and a carboxyl group (COOH).

The compound containing a hydroxyl group (OH), carboxyl group (COOH), or both, preferably has a weight-average molecular weight of 30-500. If the compound has a weight-average molecular weight of more than 500, it will reduce the polishing rate of a silica layer or reduce the dispersion stability of slurry, making the uniform supply of slurry difficult.

Non-limiting examples of the compound having a weight-average molecular weight of 30-500 and containing a hydroxyl group (OH), a carboxyl group (COOH), or both, include citrate-containing compounds, gluconate-containing compounds, malate-containing compounds, tartarate-containing compounds, 2-hydroxyisobutyrate-containing compounds, adipate-containing compounds, octanoate-containing compounds, succinate-containing compounds, ethylenediaminetetracetate (EDTA)-containing compounds, glutarate-containing compounds, and methylenesuccinate-containing compounds.

Herein, the functional group-containing compounds are intended to include not only acids containing said functional groups, for example, citric acid, gluconic acid, malic acid, tartaric acid, 2-hydroxyisobutyric acid, adipic acid, octanoic acid, succinic acid, ethylenediaminetetracetic acid (EDTA), glutaric acid and methylenesuccinic acid, but also compounds having bound to said functional groups by metals or organic functional groups.

Also, non-limiting examples of the compound having a weight-average molecular weight of 30-500 and containing a hydroxyl group (OH), a carboxyl group (COOH), or both, include mannose, glycero-galacto-heptose, erythro-mannooctose, arabino-galacto-nonose, and glutamine. The present invention is not limited to the above-described substances, and derivatives of said substances may also be included within the scope of the present invention.

The compound having a weight-average molecular weight of 30-500 and containing a hydroxyl group (OH), a carboxyl group (COOH), or both, is preferably used in an amount of 0.1-30 parts by weight based on 100 parts by weight of abrasive particles in the CMP slurry. If the content of the compound is less than 0.1 parts by weight, it will result in a reduction in selectivity and global planarity, and if it exceeds 30 parts by weight, it will result in a reduction in the polishing rate of an oxide layer.

The inventive CMP slurry may further additionally contain an additive, in addition to the compound having a weight-average molecular weight of 30-500 and containing a hydroxyl group (OH) and/or a carboxyl group (COOH). The additive may be a linear polymer acid having a weight-average molecular weight of 2,000-50,000, a graft-type polymer acid having a weight-average molecular weight of 1,000-20,000 and comprising a backbone and a side chain, or a mixture thereof.

In general, the surface of a silicon nitride is cationically charged and that of a silicon oxide is anionically charged. Therefore, in order to increase the polishing selectivity of silicon oxide to silicon nitride, an anionically charged polymer, such as a polymer acid, is adsorbed onto the cationically charged silicon nitride via electrostatic force, so that the cationically charged silicon nitride is prevented from being polished, and thus the polishing selectivity to the anionically charged silicon oxide can be increased. By doing so, it is possible to increase the polishing selectivity to an anionically charged material to a cationically charged material.

In order to maximize the electrostatic adsorption of the anionically charged polymer acid onto the structure of the cationically charged material, as well as to minimize the adsorption due to the van der Waals force, a linear polymer acid having a controlled molecular weight, a graft type polymer acid containing a backbone and a side chain, or a mixture thereof is used.

When comparing a graft type polymer acid with a linear polymer acid under the same molecular weight range, a backbone chain length of the graft type polymer acid is shorter than the chain length of the linear polymer acid, so that the graft type polymer acid can minimize an agglomeration phenomenon. Additionally, the graft type polymer acid, which has the side chain grafted to the backbone, can form an adsorption layer on the structure of the cationically charged material with higher polymer density per unit area, to a larger thickness, in proportion to the length of the side chain. When using a graft type polymer acid, it can be adsorbed selectively on the structure of a cationically charged material to a high thickness with no need for increasing the molecular weight. Thus, the structure of the cationically charged material having an absorption layer formed by electrostatic force can be protected from being polished, so that polishing selectivity of the structure of an anionically charged material (e.g., silicon oxide) to the structure of a cationically charged material (e.g., silicon nitride) may be increased.

Meanwhile, if the additive is used, it is possible to increase not only the polishing selectivity of the anionically charged material, but also that of a non-charged material. Therefore, a non-charged structure is also included in the scope of the present invention as an equivalent of the anionically charged material.

When using the graft type polymer acid that has a weight average molecular weight of 1,000-20,000 and comprises a backbone and a side chain, polishing selectivity of the structure of an anionically charged material (e.g. silicon oxide) to the structure of a cationically charged material (e.g. silicon nitride) may be higher than the above polishing selectivity obtained by using the linear polymer acid. Therefore, when using the linear polymer acid having a weight average molecular weight of 2,000-50,000 is used in combination with the graft type polymer acid that has a weight average molecular weight of 1,000-20,000 and comprises a backbone and a side chain at an adequate ratio, it is possible to control the range of polishing selectivity.

Preferably, the linear polymer acid is a compound containing a carboxyl group, and particular examples thereof include acrylic acid, methacrylic acid, itaconic acid, maleic acid, or the like. Commercially available linear polymer materials include Cerasprese 5468 available from Korea Sannopco Co. and linear polymers available from Aldrich Co., or the like.

The linear polymer acid preferably has a weight average molecular weight of 2,000-50,000. If the linear polymer acid has a weight average molecular weight less than 2,000, the polishing rate of a silicon nitride layer increases, resulting in a drop in polishing selectivity. On the other hand, if the linear polymer acid has a weight average molecular weight greater than 50,000, the polishing rate of a silicon oxide layer decreases.

Meanwhile, the graft type polymer acid may be comprised of a backbone and a side chain.

The graft type polymer acid has a weight average molecular weight of 1,000-20,000, and preferably of 3,000-15,000. If the graft type polymer acid has a weight average molecular weight of less than 1,000 or of greater than 20,000, a stable slurry composition cannot be obtained. Additionally, if the polymer acid has a weight average molecular weight of greater than 20,000, abrasive particles are agglomerated. Moreover, in the latter case, the polymer acid is adsorbed onto the structure of the anionically charged material (e.g. silicon oxide) as well as onto the structure of the cationically charged material (e.g. silicon nitride), so that the polymer acid serves as a protection layer during the polishing work. Thus, the polishing rate of the structure of the cationically charged material and the structure of the anionically charged material decrease at the same time, resulting in reduction of the polishing selectivity.

Preferably, the side chain in the graft type polymer acid preferably has a length corresponding to a molecular weight of 500-2,000, and the backbone in the graft type polymer acid has a length corresponding to a molecular weight of 500-15,000. If the length of the side chain is too short, the polymer acid cannot perform the protection function sufficiently due to the small coating thickness. On the other hand, if the length of the side chain is too long, agglomeration of particles may occur. Additionally, if the length of the backbone is too short, the polymer acid results in poor adsorption. On the other hand, if the length of the backbone is too long, agglomeration of particles may occur.

The backbone of the polymer acid serves as a major site participating in the electrostatic adsorption. Hence, the backbone preferably contains a large amount of anionic units for the purpose of adsorption onto the structure of the cationically charged material. For example, such anionic units comprise functional groups such as a carboxylic acid group as a part.

The side chain affects the electrostatic adsorption to a lower degree as compared to the backbone. Hence, it is not necessary for the side chain to be anionically charged. However, the side chain should not be cationic. The side chain mainly serves to form the adsorption coating layer with a larger thickness.

Preferably, the side chain of the graft type polymer acid comprises a macrounit derived from the polymerization or copolymerization of a hydroxyl group-, carboxyl group- and/or sulfonic acid group-containing ethylenically unsaturated monomer(s). Also, the backbone of the graft type polymer acid comprises a unit derived from a carboxyl group-containing ethylenically unsaturated monomer.

In general, slurry for polishing uses water as a dispersion medium. Hence, it is preferable that the graft type polymer acid is dissolved in water. Thus, it is also preferable that the macrounit forming the side chain of the graft type polymer acid is hydrophilic, and preferably contains units derived from monomers with high affinity to water (for example, hydroxyl group-, carboxyl group-, and/or sulfonic acid group-containing ethylenically unsaturated monomers). The macrounit is a short chain polymer, and is derived from a macromonomer polymerized from 8-16 sub-monomers and end-capped with a functional group. This is because if the side chain comprising the macrounit is too long, an agglomeration phenomenon occurs, and if the side chain comprising the macrounit is too short, the polymer acid cannot perform the protection function.

The graft type polymer acid used in the present invention may be prepared by using the method as disclosed in Korean Laid-Open Patent No. 2005-0113758, the entire content of which is incorporated herein by reference.

The graft type polymer acid preferably includes an alkoxypolyalkylene glycol mono(meth)acrylate monomer represented by the following Formula 1 at the side chain thereof:

[Formula 1]

wherein $R^1$ is a hydrogen atom or methyl;

$R^2O$ is a C2-C4 oxyalkylene or a combination thereof, and may be added randomly or in the form of a block when it is a combination of at least two kinds of C2-C4 oxyalkylene groups;

$R^3$ is a C1-C4 alkyl; and m is an average addition mole number of oxyalkylene groups, and represents an integer of 1-50.

Particularly, the alkoxypolyalkylene glycol mono(meth) acrylate monomer is contained in the polymer acid in an amount of 10-50 wt %. If the monomer is contained in an amount less than 10 wt %, it is difficult to obtain high selectivity, which is otherwise obtained from a graft type polymer acid. If the monomer is contained in an amount higher than 50 wt %, a final slurry composition using a high-selectivity additive comprising the same may show the problem of increased air bubble generation.

The linear polymer acid having a weight average molecular weight of 2,000-50,000 and the graft type polymer acid having a weight average molecular weight of 1,000-20,000 each may be used alone, or in combination.

According to the present invention, each of the linear polymer acid, the graft type polymer acid and a mixture thereof may be converted into a polymer acid salt by using a basic material in an aqueous phase. Also, the scope of the present invention may include polymer acid types other than a polymer acid salt.

The polymer acid salt according to the present invention has a pH of 4.5-8.8, and preferably of 6.0-8.0. If the pH is less than 4.5 or greater than 8.8, it is not possible to obtain a sufficient level of polishing selectivity.

When the additive is used in the CMP slurry, the basic materials that may be used include at least one material selected from the group consisting of ammonium hydroxide ($NH_4OH$) and basic amines, such as tetramethylammonium hydroxide, tetraethylammonium hydroxide, tetrapropylammonium hydroxide and tetrabutylammonium hydroxide. Such basic materials may be used alone or in combination.

The polymer acid is preferably contained in the CMP slurry in an amount of 0.1-10 wt %. If the content of the polymer acid is less than 0.1 wt %, the polishing rate of a silicon nitride layer will be increased, leading to a reduction in polishing selectivity, and dishing will occur upon polishing of a patterned wafer, and if it exceeds 10 wt %, the polishing rate of a silicon oxide layer will be decreased, leading to an increase in processing time and a reduction in selectivity, and agglomeration of abrasive particles will frequently occur.

The abrasive particles are preferably contained in the CMP slurry in an amount of 0.1-10 wt %. If the content of the abrasive particles is less than 0.1 wt %, the removal rate of an oxide layer will not be sufficiently high, and if it is more than 10 wt %, the stability of the slurry can be reduced.

As the abrasive particles, nanosized ceramic abrasive particles, including silica, alumina, zirconium oxide, titanium oxide and cerium oxide, may be used, but cerium oxide is preferred.

The CMP slurry can be prepared by adding a solution of the above-described compound having a weight-average molecular weight of 30-500 and containing a hydroxyl group (OH), a carboxyl group, or both, in a solvent (e.g., water), and a solution of a polymer acid salt in a solvent (e.g., water), to a dispersion of abrasive particles in a dispersion medium. In this respect, the concentration of the polymer acid salt aqueous solution is preferably 3-3.5 wt %, and the concentration of the abrasive particle aqueous dispersion is preferably 4-6 wt %.

Thus, water in the CMP slurry can be contained in the solution of the compound having a weight-average molecular weight of 30-500 and containing a hydroxyl group (OH), a carboxyl group, or both, the solution of the polymer acid salt, or the abrasive particle composition itself. The content of water in the CMP slurry is preferably 94-99.8 wt % based on 100 wt % of the total slurry composition. If the content of water is less than 94 wt %, the stability of the slurry will be reduced, and if it is more than 99.8%, the material removal rate of the slurry will be reduced.

Meanwhile, the CMP slurry of the present invention can be a one-component slurry consisting of one composition containing all components required for polishing, for example, abrasive particles, a dispersant, water and other additives. Alternatively, it can be a two-component slurry consisting of a set of two separate different compositions, including a dispersion composition of abrasive particles, and an additive composition for the improvement of selectivity, which are mixed with each other just before polishing. It is of note that the two-component does not necessarily mean only two kinds of solutions, and may be two or more solutions. This two-component slurry can be used when the dispersibility of abrasive particles can be reduced due to additives.

Also, the present invention provides a method for polishing a semiconductor wafer using the above-described CMP slurry. Examples of a semiconductor process, to which this method can be applied, include an STI (Shallow Trench Isolation) process and an ILD (Inter Layer Dielectric, ILD) process. The STI or ILD process can be performed according to a conventional method used in the art.

When the CMP slurry composition of the present invention is used, within-wafer non-uniformity can be controlled to less than 6.5%.

DESCRIPTION OF REFERENCE NUMERALS

100: semiconductor substrate; 101: pad silicon oxide ($SiO_2$) layer; 102: silicon nitride ($Si_3N_4$) etch stopper; 103: trench; 104: insulating silicon oxide layer; 105: gate silicon oxide layer; 200: hydroxyl group (OH) moiety; and 201: carboxyl group (COOH) moiety.

MODE FOR CARRYING OUT THE INVENTION

Hereinafter, the present invention will be described in further derail with reference to examples. It is to be understood, however, that these examples are given to more fully describe the present invention, and the scope of the present invention is not limited thereto.

Example 1

Gluconic acid was dissolved in water at a concentration of 1 wt %, and ammonium hydroxide was added thereto to a solution adjusted to a pH of 7.1. Meanwhile, linear-type anionic polyacrylic acid having a weight-average molecular weight of 7,000 was dissolved in water at a concentration of 1 wt %, and ammonium hydroxide was added thereto to prepare a solution adjusted to a pH of 7.0-8.0. 5 parts by weight, based on 100 parts by weight of the final CMP slurry composition, of a cerium oxide abrasive slurry composition (HP1-5 (pH 7.5-8.0) produced by LG Chemical Co., Ltd.) was used such that the content of abrasive particles in the CMP slurry was 0.7-0.8 wt %. To the abrasive slurry composition, the above-prepared polyacrylic acid solution was added in an amount of 10 parts by weight based on 100 parts by weight of the abrasive particles, and the gluconic acid solution was added thereto such that the gluconic acid was added in an amount of 2 wt % based on 100 parts by weight of the abrasive particles. In addition, the balance of water was added thereto, thus preparing the final CMP slurry.

Example 2

A CMP slurry was prepared in the same manner as in Example 1, except that the gluconic acid was used in an amount of 5 wt % based on 100 parts by weight of the abrasive particles.

Example 3

A CMP slurry was prepared in the same manner as in Example 1, except that the gluconic acid was used in an amount of 10 wt % based on 100 parts by weight of the abrasive particles.

Example 4

A CMP slurry was prepared in the same manner as in Example 1, except that the gluconic acid was used in an amount of 14 wt % based on 100 parts by weight of the abrasive particles.

Comparative Example 1

A CMP slurry was prepared in the same manner as in Example 1, except that the gluconic acid was not used.

Test Example 1

The CMP slurries prepared in Examples 1-4 and Comparative Example 1 above were measured for physical properties and polishing performance.

Measurement of Physical Properties of Slurry

The pH of the slurries was measured using pH meter 340 (Corning, USA), the ion conductivity was measured using 135A (ORION, Germany), the agglomerated particle size was measured using Microtrap UPA150 (Honeywell, USA), and the viscosity was measured using RS150 (Thermo HAAKE, USA). The measurement results of the physical properties are shown in Table 1 below.

TABLE 1

| Physical properties | Examples | | | | Comparative Example 1 |
| --- | --- | --- | --- | --- | --- |
| | 1 | 2 | 3 | 4 | |
| pH | 7.32 | 7.10 | 7.17 | 7.08 | 7.54 |
| Ion conductivity (ms/cm) | 0.386 | 0.446 | 0.520 | 0.570 | 0.570 |
| Agglomerated particle size (μm) | 0.332 | 0.248 | 0.209 | 0.181 | 3.4 |
| Viscosity (cP) | 1.67 | 1.63 | 1.59 | 1.58 | 1.79 |

As can be seen in Table 1, the addition of the gluconic acid to the CMP slurry significantly reduced the viscosity of the slurry and also inhibited the agglomeration of the abrasive particles.

Test of Polishing Performance

The polishing performance of the CMP slurries prepared in Examples 1-4 and Comparative Example 1 was tested. In the test, POLI-400 (GnP Technology) was used as a CMP polishing system. As wafers to be polished, wafers having thereon a 7000 Å-thick silicon oxide layer deposited by PECVD, and wafers having thereon a 1500 Å-thick silicon nitride layer deposited by LPCVD, were used. Test standards for polishing performance are as follows:

| | |
| --- | --- |
| Pad | IC 1400 (Rodel, USA) |
| Measurement of wafer thickness | Nanospec6100 (Nanometerics, USA) |
| Head speed | 90 rpm |
| Spindle speed | 90 rpm |
| Down force | 4 psi |
| Back pressure | 0 psi |
| Slurry feed rate | 100 mL/min |

The wafers were polished using each of the CMP slurries prepared in Examples 1-4 and Comparative Example 1, and then, based on a change in thickness resulting from the polishing, material removal rate, removal selectivity and within-wafer non-uniformity were measured. The measurement results are shown in Table 2 below.

TABLE 2

| Items | Examples | | | | Comparative Example 1 |
|---|---|---|---|---|---|
| | 1 | 2 | 3 | 4 | |
| Oxide removal rate (Å/min) | 4611 | 4676 | 4441 | 4379 | 4631 |
| Delta WIWNU (%) | 6.02 | 3.44 | 2.97 | 2.36 | 7.61 |
| Nitride removal rate (Å/min) | 44 | 45 | 83 | 87 | 54 |
| Selectivity | 105 | 104 | 54 | 50 | 86 |

As can be seen in Table 2 above, in the case where the CMP slurries of Examples 1-4 were used, as the amount of addition of the monomolecular substance gluconic acid was increased, global planarity was improved (Delta WIWNU was decreased). This polishing planarity in Examples 1-4 was significantly higher than that in Comparative Example 1.

INDUSTRIAL APPLICABILITY

As can be seen from the foregoing, according to the present invention, the agglomerated particle size of abrasive particles in the CMP slurry can be reduced, while the viscosity of the CMP slurry can be reduced and the global planarity of wafers upon polishing can be improved. Thus, the CMP slurry can be advantageously used in processes for manufacturing semiconductor devices requiring fine patterns and can improve the reliability and production of semiconductor devices through the use thereof in semiconductor processes. Also, the CMP slurry of the present invention can uniformly remove a $Si_3N_4$ etch stopper layer throughout a wafer during a CMP process to minimize a change in the wafer thickness, so that the difference in level between active regions and field regions in the wafer can be eliminated. The CMP slurry of the present invention cannot adversely affect the characteristics of transistors and devices.

Although the preferred embodiment of the present invention has been described for illustrative purposes, those skilled in the art will appreciate that various modifications, additions and substitutions are possible, without departing from the scope and spirit of the invention as disclosed in the accompanying claims.

The invention claimed is:

1. A CMP slurry comprising:
a CMP mixture containing abrasive particles, water, and an anionically charged graft-type polymer acid having a weight-average molecular weight of 3,000-15,000 and comprising a backbone and a side chain, or a mixture of an anionically charged linear polymer acid having a weight-average molecular weight of 2,000-50,000 and an anionically charged graft-type polymer acid having a weight-average molecular weight of 1,000-20,000 and comprising a backbone and a side chain, as an additive, wherein the CMP mixture has a first viscosity; and
a viscosity decreasing compound having a weight-average molecular weight of 30-500 and containing a hydroxyl group (OH), a carboxyl group (COOH), or both,
wherein the viscosity decreasing compound is added to the CMP mixture, such that the CMP slurry has a viscosity 5-30% lower than the first viscosity and is in a range of 1.1-1.9 cPs.

2. The CMP slurry according to claim 1, which has a within-wafer non-uniformity (WIWNU) of less than 6.5%.

3. The CMP slurry according to claim 1, wherein the CMP mixture having a weight-average molecular weight of 30-500 and containing a hydroxyl group (OH), a carboxyl group (COOH), or both, is one or more selected from the group consisting of citrate-containing compounds, gluconate-containing compounds, malate-containing compounds, tartarate-containing compounds, 2-hydroxyisobutyrate-containing compounds, adipate-containing compounds, octanoate-containing compounds, succinate-containing compounds, ethylenediaminetetracetate (EDTA)-containing compounds, glutarate-containing compounds, methylenesuccinate-containing compounds, mannose, glycero-galacto-heptose, erythro-manno-octose, arabino-galacto-nonose, and glutamine.

4. The CMP slurry according to claim 1, wherein the CMP mixture having a weight-average molecular weight of 30-500 and containing a hydroxyl group (OH), a carboxyl group (COOH), or both, is contained in an amount of 0.1-30 parts by weight based on 100 parts by weight of the CMP slurry.

5. The CMP slurry according to claim 1 wherein the additive is contained in an amount of 0.1-10 parts by weight based on 100 parts by weight of the CMP slurry.

6. The CMP slurry according to claim 1, wherein the anionically charged linear polymer acid is selected from the group consisting of acrylic acid, methacrylic acid, itaconic acid and maleic acid, and the graft-type polymer acid contains an alkoxypolyalkylene glycol mono(meth)acrylate monomer represented by Formula 1:

[Formula 1]

wherein $R^1$ is a hydrogen atom or methyl;
$R^2O$ is a C2-C4 oxyalkylene or a combination thereof, and may be added randomly or in the form of a block when it is a combination of at least two kinds of C2-C4 oxyalkylene groups;
$R^3$ is a C1-C4 alkyl; and
m is an average addition mole number of oxyalkylene groups, and represents an integer of 1-50.

7. The CMP slurry according to claim 1, wherein the abrasive particles are cerium oxide particles.

8. The CMP slurry according to claim 1, wherein the abrasive particles are contained in an amount of 0.1-10 parts by weight based on 100 parts by weight of the CMP slurry.

9. A method for polishing a semiconductor wafer, said method comprising:
planarizing a shallow trench isolation containing a silicon oxide layer and a silicon nitride layer using a CMP slurry that includes a viscosity decreasing compound having a weight-average molecular weight of 30-500 and containing a hydroxyl group (OH), a carboxyl group (COOH), or both, added to a CMP mixture which has abrasive particles, water, an anionically charged graft-type polymer acid having a weight-average molecular weight of 3,000-15,000 and comprising a backbone and a side chain, or a mixture of an anionically charged linear polymer acid having a weight-average molecular weight of 2,000-50,000 and an anionically charged graft-type polymer acid having a weight-average molecular weight of 3,000-15,000 and comprising a backbone and a side chain, as an additive, and a first viscosity, such that the CMP slurry has a viscosity 5-30% lower than the first viscosity and is in a range of 1.1-1.9 cPs.

10. The method according to claim 9, wherein within-wafer non-uniformity (WIWNU) is controlled to less than 6.5%.

11. The method according to claim 9, wherein the CMP mixture having a weight-average molecular weight of 30-500 and containing a hydroxyl group (OH), a carboxyl group (COOH), or both, is one or more selected from the group consisting of citrate-containing compounds, gluconate-containing compounds, malate-containing compounds, tartarate-containing compounds, 2-hydroxyisobutyrate-containing compounds, adipate-containing compounds, octanoate-containing compounds, succinate-containing compounds, ethylenediaminetetracetate (EDTA)-containing compounds, glutarate-containing compounds, methylenesuccinate-containing compounds, mannose, glycero-galacto-heptose, erythro-manno-octose, arabino-galacto-nonose, and glutamine.

12. The method according to claim 9, wherein the CMP mixture having a weight-average molecular weight of 30-500 and containing a hydroxyl group (OH), a carboxyl group (COOH), or both, is contained in an amount of 0.1-30 parts by weight based on 100 parts by weight of the CMP slurry.

13. The method according to claim 9, wherein the additive is contained in an amount of 0.1-10 parts by weight based on 100 parts by weight of the CMP slurry.

14. The method according to claim 9, wherein the anionically charged linear polymer acid is selected from the group consisting of acrylic acid, methacrylic acid, itaconic acid and maleic acid, and the graft-type polymer acid contains an alkoxypolyalkylene glycol mono(meth)acrylate monomer represented by Formula 1:

[Formula 1]

wherein $R^1$ is a hydrogen atom or methyl;
$R^2O$ is a C2-C4 oxyalkylene or a combination thereof, and may be added randomly or in the form of a block when it is a combination of at least two kinds of C2-C4 oxyalkylene groups;
$R^3$ is a C1-C4 alkyl; and
m is an average addition mole number of oxyalkylene groups, and represents an integer of 1-50.

15. The method according to claim 9, wherein the abrasive particles are cerium oxide particles.

16. The method according to claim 9, wherein the abrasive particles are contained in an amount of 0.1-10 parts by weight based on 100 parts by weight of the CMP slurry.

17. A method for polishing a semiconductor wafer comprising:
providing a CMP slurry that includes a viscosity decreasing compound having a weight-average molecular weight of 30-500 and containing a hydroxyl group (OH), a carboxyl group (COOH), or both, added to a CMP mixture which has abrasive particles, water, an anionically charged graft-type polymer acid having a weight-average molecular weight of 3,000-15,000 and comprising a backbone and a side chain, or a mixture of an anionically charged linear polymer acid having a weight-average molecular weight of 2,000-50,000 and an anionically charged graft-type polymer acid having a weight-average molecular weight of 3,000-15,000 and comprising a backbone and a side chain, as an additive, and a first viscosity, such that the CMP slurry has a viscosity 5-30% lower than the first viscosity; and
applying the CMP slurry in a shallow trench isolation.

18. The method according to claim 17, the viscosity of the CMP slurry is in a range of 1.1-1.9 cPs.

* * * * *